United States Patent
Werner et al.

(10) Patent No.: US 8,324,613 B2
(45) Date of Patent: Dec. 4, 2012

(54) METHOD FOR PRODUCING AN ELECTRONIC DEVICE WITH A LAYER STRUCTURE AND AN ELECTRONIC DEVICE

(75) Inventors: Ansgar Werner, Dresden (DE); Jan Blochwitz-Nimoth, Dresden (DE); Tobias Canzler, Dresden (DE)

(73) Assignee: Novaled AG, Dresden (DE)

( * ) Notice: Subject to any disclaimer, the term of this patent is extended or adjusted under 35 U.S.C. 154(b) by 705 days.

(21) Appl. No.: 12/092,167

(22) PCT Filed: Oct. 23, 2006

(86) PCT No.: PCT/EP2006/010200
§ 371 (c)(1),
(2), (4) Date: Aug. 19, 2008

(87) PCT Pub. No.: WO2007/051540
PCT Pub. Date: May 10, 2007

(65) Prior Publication Data
US 2009/0179189 A1 Jul. 16, 2009

(30) Foreign Application Priority Data

Nov. 1, 2005 (EP) .................................... 05023806
Sep. 12, 2006 (EP) .................................... 06019069

(51) Int. Cl.
*H01L 35/24* (2006.01)
(52) U.S. Cl. .................... 257/40; 257/12; 257/E51.001
(58) Field of Classification Search .................... 257/12, 257/40, E51.001
See application file for complete search history.

(56) References Cited

U.S. PATENT DOCUMENTS

| | | | |
|---|---|---|---|
| 3,644,770 A | 2/1972 | Bell | |
| 3,673,011 A | 6/1972 | Strull | |
| 3,913,999 A | 10/1975 | Clarke | |
| 5,093,698 A | 3/1992 | Egusa | |
| 5,315,129 A | 5/1994 | Forrest et al. | |

(Continued)

FOREIGN PATENT DOCUMENTS
DE          10261609          7/2004
(Continued)

OTHER PUBLICATIONS

Zhou et al., Stable and Efficient Electrophosphorescent Organic Light-Emitting Devices Grown by Organic Vapor Phase Depostion; Applied Physics Letters 86, pp. 021107-1-021107-3.

(Continued)

*Primary Examiner* — Anthony Ho
(74) *Attorney, Agent, or Firm* — Sutherland Asbill & Brennan, LLP

(57) ABSTRACT

The invention relates to a method for producing a layer structure in an electronic device, especially in an organic light emitting device, the method comprising a step of producing the layer structure as a composite layer structure with free charge carriers generated by charge transfer between a first material and a second material, wherein the composite layer structure is provided as a stack of at least three non-mixed sub-layers made of the first material and the second material, respectively, wherein within the stack of the at least three non-mixed sub-layers each first material sub-layer is followed by an adjacent second material sub-layer and each second material sub-layer is followed by an adjacent first material sub-layer, and wherein the first material and the second material are selected to form a host-dopant material system for the electrical doping. The invention also relates to an electronic device.

21 Claims, 3 Drawing Sheets

U.S. PATENT DOCUMENTS

Figure 1:
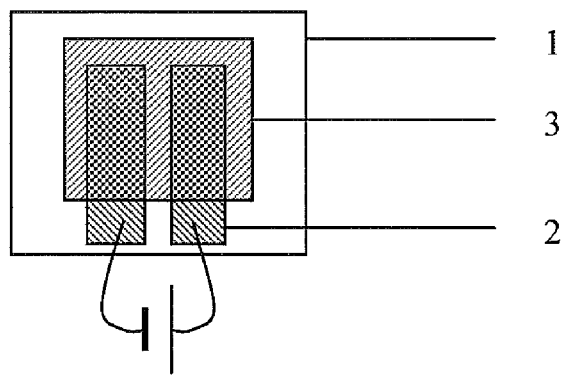

| | | | |
|---|---|---|---|
| 5,922,396 | A | 7/1999 | Thompson et al. |
| 6,287,712 | B1 | 9/2001 | Bulovic et al. |
| 6,312,836 | B1 | 11/2001 | Bulovic et al. |
| 6,387,546 | B1 | 5/2002 | Hamada et al. |
| 6,605,317 | B1 | 8/2003 | Kathirgamanathan et al. |
| 6,620,528 | B1 | 9/2003 | Yamazaki |
| 6,809,333 | B2 | 10/2004 | Ishikawa et al. |
| 6,818,329 | B1 | 11/2004 | Liao et al. |
| 2001/0055841 | A1 | 12/2001 | Yamazaki et al. |
| 2003/0180457 | A1 | 9/2003 | Murakami et al. |
| 2003/0197465 | A1 | 10/2003 | Qiu et al. |
| 2004/0016907 | A1 | 1/2004 | Shi |
| 2004/0037987 | A1 | 2/2004 | Carlton et al. |
| 2004/0173929 | A1 | 9/2004 | Ghosh et al. |
| 2005/0016461 | A1 | 1/2005 | Klug et al. |
| 2005/0040390 | A1 | 2/2005 | Pfeiffer et al. |
| 2005/0042548 | A1 | 2/2005 | Klauk et al. |
| 2005/0061232 | A1 | 3/2005 | Werner et al. |
| 2005/0072971 | A1 | 4/2005 | Marrocco et al. |
| 2005/0136232 | A1 | 6/2005 | Forrest et al. |
| 2005/0145179 | A1 | 7/2005 | Cattaneo |
| 2005/0179370 | A1 | 8/2005 | Nakayama et al. |
| 2006/0079004 | A1 | 4/2006 | Werner et al. |
| 2007/0249148 | A1 | 10/2007 | Werner et al. |
| 2007/0278479 | A1 | 12/2007 | Werner et al. |
| 2009/0011582 | A1 | 1/2009 | Birnstock et al. |

FOREIGN PATENT DOCUMENTS

| | | |
|---|---|---|
| JP | 5931865 | 2/1984 |
| WO | 02/093664 | 11/2002 |
| WO | WO03/088271 | 10/2003 |
| WO | 2004/070787 | 8/2004 |

OTHER PUBLICATIONS

Shtein et al., Material Transport Regimes and Mechanisms for Growth of Molecular Organic Thin Films Using Low-Pressure Organic Vapor Phase Deposition; Journal of Applied Physics, vol. 89, Jan. 15, 2001; pp. 1470-1476.

Shtein et al., Effects of Film Morphology and Gate Dielectric Surface Preparation on the Electrical Characteristics of Organic-Vapor-Phase-Deposited Pentacene Thin-Film Transistors; Applied Physics Letters vol. 81; Jul. 8, 2001; pp. 268-270.

Burrows et al., Organic Vapor Phase Deposition; A New Method for the Growth of Organic Thin Films With Large Optical Non-Linearities; Journal of Crystal Growth 156 (1995); pp. 91-98.

Baldo et al., Low Pressure Organic Vapor Phase Deposition of Small Molecular Weight Organic Light Emitting Device Structures; Applied Physics Letters 71; Nov. 24, 1997, pp. 3033-3035.

Baldo et al.; Organic Vapor Phase Deposition; Adv. Mater. 1998, 10, No. 18, pp. 1505-1514.

Bard, A. J., Faulkner, R.J., Electrochemical Methods: Fundamentals and Applications, Wiley, 2nd Ed., 2000.

Bloom, C. J. et al., "Low work function reduced metal complexes as cathodes in organic electroluminescent devices," J. of Phyiscal Chemistry B, vol. 107, No. 13, pp. 2933-2938.

Elwell, D., "Electrocrystallization of semiconducting materials from molten salt and orgnaic solutions," Journal of Crystal Growth, vol. 52, 1981, pp. 741-752.

Gao Y. et al., "Cs doping and energy level shift in CuPC", Chemical Physics Letters. North-Holland, Amsterdam, NL, vol. 380, Oct. 21, 2003, p. 451-455.

Gebeyehu, et al., "Bulk-heterojunction photovoltaic devices based on donor-acceptor organic small molecules blends," Solar Energy Materials and Solar Cells, 2003, vol. 79, pp. 81-92 (p. 1-11 on enclosed copy).

Harada, Kentaro et al., "Realization of organic pn-homojunction using a novel n-type doping technique, Proceedings of SPIE—The international Society for Optical Engineering; Organic Optoelectronics and Photonics 2004," vol. 5464, Sep. 2004, pp. 1-9.

Jianmin Shi, et al., "Doped Organic Electroluminescent Devices with Improved Stability," Appl. Phys. Lett. 70(13), Mar. 31, 1997, pp. 1665-1667.

Muramatsu, T. et al., "Preparation and Properties of a novel heterocyclic dispiro compound, 3, 10-diaza-N,N-dimethyldispiro[5.0.5.3]pentadeca-1,4,8,11-tetraene," Chemistry Letters, pp. 151-152, (1996).

Pfeiffer, M, et al., "Doped Organic semiconductors: physics and application in light emitting diodes," Organic Electronics, Elsevier, Amsterdam, NL, vol. 4, No. 2/3, Sep. 2003, pp. 89-103, XP001177135, ISSN: 1556-1199.

Tang, C. W., et al., "Electroluminescence of doped organic thin films," Journal of Applied Physics, (1989), vol. 65:9, pp. 3610-3616.

Tang, C.W. et al., "Organic electroluminescent diodes," Applied Physics Letters, vol. 51, No. 12, Sep. 21, 1987, pp. 913-915.

Tsiper, E.V. and Soos, Z.G.; "Charge redistribution and polarization energy of organic molecular crystals," Physical Review B; vol. 64; 195124-1.

Vaid T.P. et al, "Investigations of the 9,10-diphenylacridyl radical as an isostructural dopant for the molecular semiconductor 9, 10-diphenylanthracene," Chemistry of Materials, American Chemical Society, Bd. 15, Nr. 22, 4292-4299 (2003).

Wintgens, V. et al., "Reduction of Pyrylium Salts: Study by ESR and UV_Visible Spectroscopy of the Reversible Dimerization of the Pyranyl Radical," New. J. Chem., 10/6, 345-350 (1986).

Zhou C. et al., "Modulated chemical doping of individual carbon nanotubes," Science, American Association for the Advancement of Science, vol. 290, No. 5496, pp. 1552-1555.

Response to Office Action; U.S. Appl. No. 11/576,553; (Sep. 25, 2009).

Non-Final Office Action; U.S. Appl. No. 11/576,553; (Jun. 25, 2009).

Non-final Rejection; U.S. Appl. No. 11/241,477; Jun. 18, 2007.

Response to Office Action; U.S. Appl. No. 11/241,477; Sep. 18, 2007.

Non-final Rejection; U.S. Appl. No. 11/241,477; Dec. 14, 2007.

Notice of Allowance; U.S. Appl. No. 11/241,477; Jun. 13, 2008.

Notice of Allowance; U.S. Appl. No. 11/241,477; Oct. 20, 2008.

Disclosure Under 37 C.F.R. 1.56 (submitted herewith).

Non-final Office Action, U.S. Appl. No. 10/595,319; Jan. 11, 2010.

Hamm, S. "Rectifying organic juntions of molecular assemblies based on perylene ion salts," J. Chem. Phys., vol. 103, No. 24, Dec. 22, 1995, pp. 10689-10695.

Blochwitz, J. et al., "Interface electronic structure of organic semiconductors with controlled doping levels," Org. Electronics 2, 97 (2001).

Akers, K.L.et al., "The Spatially Resolved Composition of K-Doped C60 Films," Thin Solid Films, vol. 257 (1995): pp. 204-210.

Yamashita, K. et al., "Fabrication of an Organic p-n Homojunction Diode Using Electrochemically Cation- and Photochemically Anion-Doped Polymer," Jpn. J. Appl. Phys., vol. 34 (Jul. 1995); pp. 3794-3797.

Werner, A.G. et al., "n-Type Doping of Organic Thin Films Using Cationic Dyes," Adv. Funct. Mater., vol. 14, No. 3 (Mar. 2004): pp. 255-260.

Werner, A. G. et al., "Pyronin B as a donor for n-type doping of organic thin films," Applied Physics Letters, vol. 82, No. 25, Jun. 23, 2003, pp. 4495-4497.

Nollau, A. et al., "Controlled n-type doping of a molecular organic semiconductor: naphthalenetetracarboxylic dianhydride (NTCDA) doped with bis(ethylenedithio)-tetrathiafulvalene (BEDT-TTF)," J. Appl. Phys., vol. 87, No. 9, May 1, 2006, pp. 4340-4343.

METHOD FOR PRODUCING AN ELECTRONIC DEVICE WITH A LAYER STRUCTURE AND AN ELECTRONIC DEVICE

The invention relates to a method for producing a layer structure in an electronic device and an electronic device.

BACKGROUND OF THE INVENTION

In the case of electrically doped layers, the production of such layers requires the deposition of materials, host and dopant, which are supposed to undergo a chemical reaction in the layer. This holds both for p- and n-type doping. More precisely, a redox reaction occurs between host and dopant molecules and results in an at least partial charge transfer, thereby providing additional free charge carriers which increase the electrical conductivity compared to the non-doped host material. Electrically doped layers find their main application so far in the production of PIN devices, such as PIN OLEDs (OLED—Organic Light Emitting Diode) or PIN solar cells. PIN is the abbreviation for a stack consisting of a p-doped zone on an intrinsic zone on a n-doped zone. For other applications the intrinsic zone is skipped resulting in a PN junction.

The use of electrically doped structures helps to improve the device parameters of OLEDs, such as low power consumption, long lifetime, extended material and thickness flexibility. The general structure of a PIN OLED is the following:
a) an anode,
b) a hole transport layer applying p-doping (HTL),
c) an intrinsic zone comprising an emitting layer (EML), and optionally an electron blocking layer (EBL) towards the HTL and a hole blocking layer (HBL) towards the ETL,
d) an electron transport layer applying n-doping (ETL), and
e) a cathode.

Additional functional layers may be provided, such as charge carrier injection layers.

The emitting layer is usually established as a mixed layer of an emitter and a host material (blending, no electrical doping). For some realizations of high efficiency OLEDs or OLEDs emitting several portions of the visible light spectrum, e. g. white light emitting OLEDs, the emission zone can as well exist of even more layers, all of them electrically non-doped.

PIN OLEDs have been processed in VTE (VTE—Vacuum Thermal Evaporation), i. e. at least layers two to four are produced in VTE. Here, the materials are thermally evaporated from independent crucibles. Temperature is chosen to meet the evaporation point of the material at high vacuum conditions which is usually in the range from 100-400° C. The depositions rates of the materials are usually in the range of 0.01 to 0.5 nm/s, for high throughput deposition as well up to 5 nm/s. Pressure conditions used are usually $<10^{-3}$ mbar, preferably $<10^{-5}$ mbar.

In the state of the art, electrical doping of thin films is performed by VTE. There, the dopant and the host materials are evaporated simultaneously in different crucibles. The depositions rates of the materials in co-deposition are usually in the range of less than 0.01 to 5 nm/s. However, the deposition takes place at low vapour pressure of the materials. The evaporation cones of the crucibles are aligned towards the sample. In a co-deposition the cones of host and dopant superpose partially. Nevertheless, due to the low vapour pressure leading to a long mean free path for a molecule in the gas phase and the rather short shared path of the host and dopant, they do mainly mix in the growing layer. There, the doping process takes place by a chemical reaction of dopant and host material. Collisions and/or chemical reactions of the molecules in the gas phase are highly unlikely. Usually, with a doping concentration of 0.2 to 10 mol-% electrical conductivities of about $10^{-7}$ to $10^{-5}$ S/cm can be achieved compared to less than $10^{-8}$ S/cm for non-doped host material.

Organic vapour phase deposition (OVPD™) has been demonstrated to be an efficient and versatile means for the growth of organic electronic components based on small molecular weight materials that has many attributes that make it suitable for high volume production of devices (see M. A. Baldo et al., Appl. Phys. Lett. 71, 3033 (1997); M. A. Baldo et al., Adv. Mater. (Weinheim, Germany) 10, 1505 (1998); M. Shtein et al., J. Appl. Phys. 89, 1470 (2001)). The OVPD process is based on the sublimation of small molecular weight organic materials into an inert carrier gas stream in a hot walled chamber. The gas transports the molecules to a cooled substrate where they rapidly condense to form the desired film.

A number of organic electronic devices grown by OVPD have been reported, including organic light-emitting devices (OLEDs), thin film transistors, and photovoltaic cells (see M. Shtein et al., J. Appl. Phys. 89, 1470 (2001); M. Shtein et al., Appl. Phys. Lett. 81, 268 (2002); P. E. Burrows et al., J. Cryst. Growth 156, 91 (1995)).

Compared to the conventional technology of vacuum thermal evaporation, OVPD has potential advantages such as improved thickness uniformity, precision control of layer interfaces, elimination of parasitic deposition on the chamber walls (leading to high deposition efficiency and reduction in system maintenance), and of simultaneous deposition of multiple materials/components.

The multi-chamber tool usually consists of an OVPD system integrated with a vacuum transfer chamber, a VTE chamber for deposition of high evaporation temperature organics and cathode metals, and a nitrogen glove box. The OVPD system is comprised of remotely positioned source furnaces, gas manifolds to combine about ten organic sources into a single inert gas flow stream, and the deposition chamber. The organic materials are heated in independent source cells in the furnaces, thereby eliminating cross contamination. The organic vapour is transported from the source cells by preheated and purified nitrogen gas via heated lines/pipes (temperature above sublimation temperature of the organic material with highest sublimation temperature to be transported through pipe system) into the deposition chamber. The deposition chamber contains a showerhead vapour distributor located several centimeters above the substrate surface, which is cooled to a temperature in the range of 5 to 40° C. The deposition chamber pressure is at about 0.7 Torr, while the source cell pressure is at 7.5 Torr. This reflects the requirement for maintaining a nearly ten-fold differential in upstream pressure to achieve the desired deposition rates, while overcoming the line impedances due to the remote placement of the organic sources from the reactor vessel.

Since the source temperature is kept constant to within less than 1° C. of its set point, the deposition rate is primarily controlled by the carrier gas mass flow rate, thus eliminating the need for an in situ crystal thickness monitor which is required for VTE. Hence deposition rate is calibrated based on the reactor conditions, and thereafter the growth time is set to achieve the required thickness, which is checked post-growth, e. g. by ellipsometry. At a constant source temperature, the carrier gas flow rate Q through an individual container, determines the concentration of the organic vapour. The total flow is maintained at about 1000 sccm to ensure consistent spatial thickness uniformity. Each source container is then calibrated by obtaining the dependence of deposition rate r on Q.

Mixed layers can be deposited by OVPD. A source calibration is used to choose appropriate deposition rates and time for each component material in the organic electronic device. In particular, for the emission layer of an OLED, the host (also labelled matrix) and dopant materials are combined in the vapour phase in a small mixing volume placed at the input to the showerhead, thus enabling a homogeneous blending of the host and multiple dopant molecules before they reach the substrate. In other modifications of the OVPD system mixing of carrier gases is done in or before the line system at a certain distance from the showerhead. Since the deposition rate is calibrated by thickness measurements, the doping concentration is defined by the volume (thickness) ratio between the host and dopant material as opposed to the weight percentage conventionally used for VTE.

OVPD has been demonstrated for layers consisting of one material or several materials which are chemically inert (see T. X. Zhou et al., Appl. Phys. Lett. 86, 21107 (2005)). That means the materials are co-deposited as a blend of molecules which do not undergo a chemical reaction with each other. A typical example for such a co-deposition is the emittet doping in the emission layer of an OLED. Another example is the co-deposition of two materials either to improve the ability to transport both electrons and holes of the layer or the morphology or to increase glass-transition temperature.

The processing of layer growth in OVPD is different from the process using VTE: Here, the materials are heated in independent source cells. The organic vapour is transported from the source cells by preheated nitrogen gas via heated lines into the deposition chamber. The partial gas pressure of the materials is usually higher than in VTE and, more important, the vapour of dopant and host material are mixed in the line. Thus, dopant and host molecules have a higher interaction probability before the reach the substrate. As a result, they can undergo a chemical reaction before reaching the substrate and, depending on the material, will fall out or stick to the wall of the line and are not incorporated in the layer. In general, charge-transfer complexes or salts likely to be formed in such a reaction are known to be less volatile than the neutral components they have been formed from. This can be due to the high dipole moment or strong ionic bonding typical for such charge-transfer complexes or salts. Furthermore, due to frequent collisions with the walls and/or carrier gas molecules, the momentum of the organic molecules is not conserved. In consequence, a reduced conductivity is obtained for the doped layer in OVPD, in contrast to VTE.

SUMMARY OF THE INVENTION

It is an object of the invention to provide a method for producing a layer structure in an electronic device and an electronic device with a layer structure wherein the layer structure is manufactured more easily. In addition, it is an object of the invention to allow production of the layer structure by a variety of techniques.

According to one aspect of the invention a method for producing a layer structure in an electronic device, especially in an organic light-emitting device, is provided, the method comprising a step of producing the layer structure as a composite layer structure with free charge carriers generated by charge transfer between a first material and a second material, wherein the composite layer structure is provided as a stack of at least three non-mixed sub-layers made of the first material and the second material, respectively, wherein within the stack of the at least three non-mixed sub-layers each first material sub-layer is followed by an adjacent second material sub-layer and each second material sub-layer is followed by an adjacent first material sub-layer, and wherein the first material and the second material are selected to form a host-dopant material system for the electrical doping.

According to another aspect of the invention an electronic device, especially an organic light-emitting device, is provided, wherein: a layer structure is provided as a composite layer structure with free charge carriers generated by charge transfer between a first material and a second material; the composite layer structure is a stack of at least three non-mixed sub-layers made of the first material and the second material, respectively; within the stack of the at least three non-mixed sub-layers each first material sub-layer is followed by an adjacent second material sub-layer and each second material sub-layer is followed by an adjacent first material sub-layer, and the first material and the second material are selected to form a host-dopant material system for the electrical doping.

Alternating deposition of layers of the first and second material selected to provide a host-dopant material system results in a composite layer structure provided as a layered or discontinuous electrically doped structure. Such electrically doping effect is based on a chemical redox reaction between the first (host) material and the second (dopant) material, mainly at the interfaces between the first material and the second material in the composite layer structure, which in turn leads to an at least partial charge transfer between the first material and the second material thereby providing (additional) free charge carriers, namely holes and electrons. In a preferred embodiment, the energetic difference between the HOMO level (HOMO—Highest Occupied Molecular Orbital) of the first material providing a matrix material and the LUMO level (LUMO—Lowest Unoccupied Molecular Orbital) of the second material is smaller than 0.5 eV.

In some applications it can be beneficial that the first material is substantially transparent to visible light.

The first material can be selected from electron transport materials or hole transport materials typically used in electronic devices. Examples for electron transport materials ate tetracyano-quinodimethane, fullerene C60, heteroaromatic compounds such as oxadiazole derivatives, phenanthrolines, metal complexes such as tris(8-hydroxyquinoline) aluminium or others. Most electron transport materials have an aromatic character. Typical hole transport materials are aromatic amines such as benzidines, tetrathiafulvalene derivatives or oligothiophenes. It may be beneficial that the reduction potential of an electron transport material used in the composite layer is lower than −1.5 V vs. Fc/Fc+ (Fc/Fc+ denoting the ferrocene/ferrocenium reference redox couple), preferred lower than −2 V vs. Fc/Fc+, more preferred lower than −2.3 V vs. Fc/Fc+. It may be beneficial that the oxidation potential of an hole transport material used in the composite layer is higher than −0.2V vs. Fc/Fc+, preferred higher than 0V vs Fc/Fc+, more preferred higher than 0.2V vs. Fc/Fc+.

The second material can be selected from donor or acceptor type materials. In a typical composite layer it may be suitable to use a donor (acceptor) type second material in conjunction with an electron (hole) transporting first material. Donor and acceptor type materials can be organic or non-organic materials. Donor type materials can include alkali and earth alkali compounds, including alkali and earth alkali metals, metal complexes such as Ruthenium tris-(terpyridine), Tetrakis(1,2,3,3a,4,5,6,6a,7,8-decahydro-1,9,9b-triazaphenalenyl)ditungsten(II)), organic donors such as tetrathiafulvalene derivatives or crystal violet. Acceptor type materials can be chinon derivatives such as 7,7,8,8-Tetracyano-2,3,5,6-tetrafluoroquino-dimethane or metal oxides such as $WO_3$, $MoO_3$ or $V_2O_5$ or lewis acids such as FeCl3 or SbCl5.

It may be beneficial that a donor type material used in the composite layer has an oxidation potential of less than −1.5V vs. Fc/Fc+, preferred less than −2V vs.Fc/Fc+, and more preferred less than −2.2V vs. Fc/Fc+.

It may be beneficial that a donor or an acceptor type material used in the composite layer is molecular, i.e. it consists of at least two atoms, preferred more than six atoms.

In some instances, acceptor or donor type materials are created in situ during or after deposition from a precursor material. As an example, the donor type crystal violet radical can be created in situ from a leuco crystal violet precursor. It is to be understood that the required properties for the second material do not relate to the precursor, but to the compound undergoing charge transfer with the second material.

The second material is selected from the following group of dopant materials: p-dopant, for example Li, and n-dopant, for example F4-TCNQ (7,7,8,8-Tetracyano-2,3,5,6-tetrafluoro-quinodimethane). In one embodiment, Li can be used in combination with the first material BPhen (4,7-Diphenyl-1,10-phenanthroline). In an other embodiment, F4-TCNQ may be used in combination with the first material MeOTPD (N,N,N',N'-tetrakis(4-methoxyphenyl)benzidine) as a matrix.

In a preferred embodiment, the individual layers within the composite layer structure are provided with an electrical conductivity like it is provided by conventional co-deposition. For that purpose the mean thickness of the single stack of the dopant molecules is in one embodiment preferably not bigger than about its molecular diameter, thereby allowing direct contact between almost every dopant and a matrix molecule.

In a preferred embodiment, the step of providing the stack of the at least three non-mixed sub-layers comprises producing at least some of the non-mixed sub-layers by vacuum thermal evaporation.

According to a further embodiment, the step of providing the stack of the at least three non-mixed sub-layers comprises producing at least some of the non-mixed sub-layers by organic vapor phase deposition. This is achieved, for example, by a discontinuous release of dopant and host molecules into a gas stream in such a way, that each volume element of the gas stream contains essentially only the dopant or the host molecules. More specifically, a sequence of operation of source cells can be a followed: Opening a dopant material source and release of an amount of dopant material to the gas stream; close dopant material source; wait; open a host material source and release of an amount of the host material to the gas stream; close the host source; wait; and start over. Rinsing the line in between the material deposition with pure nitrogen gas or another inert process gas for up to few seconds might be applied to ensure that materials do not mix and react in the gas phase. The waiting time can be adjusted in such a way to prevent that dopant and host molecules are released into the same volume element of the gas stream and/or prevented from entering the same volume element in the course of the transport to the showerhead by diffusion, convection, turbulences or other transport mechanisms. The amount of released dopant and host material into the gas stream can be adjusted to achieve the desired doping rate at the substrate.

In still a further embodiment, the stack of the at least three non-mixed sub-layers is provided with an electrical conductivity of at least about $10^{-8}$ S/cm, preferably with an electrical conductivity of at least about $10^{-7}$ S/cm, and more preferably with an electrical conductivity of at least about $10^{-5}$ S/cm.

According to a preferred embodiment, the step of providing the stack of the at least three non-mixed sub-layers comprises producing the second material sub-layer(s) with a layer thickness between about 0.1 nm and about 5 nm, preferably with a layer thickness between about 0.1 nm and about 2 nm, and more preferably with a layer thickness between about 0.1 nm and about 1 nm.

In another preferred embodiment, the step of providing the stack of the at least three non-mixed sub-layers comprises producing the first material sub-layer(s) with a layer thickness between about 5 nm and about 15 nm, preferably with a layer thickness between about 8 nm and about 12 nm.

In a preferred embodiment, at least one of the first material and the second material is an organic material.

According to a further embodiment, the step of producing the layer structure as the composite layer structure comprises producing the composite layer structure with a molar ratio between about 10:1 and about 1:10000 (second material:first material), preferably with a molar ratio between about 1:1 and about 1:1000, and more preferably with a molar ratio between about 1:10 and about 1:100, wherein the molar ratio is configured by producing a thickness ratio between a thickness of the second material sub-layer(s) and a thickness of the first material sub-layer(s) according to the molar ratio.

The doping ratio is established by choosing appropriate layer thicknesses for first and second material. For instance, a volume-doping ratio of about 5% requires a layer thickness ratio of about 20:1 for first and second material. The doping ratio is established by choosing appropriate layer thicknesses for first and second material. The desired thickness is controlled, for example, by the deposition times at a known deposition rate r. As the layers of second (dopant) material are preferably rather thin (usually <1 nm), it might be necessary to lower the deposition rate to meet the accuracy of layer thickness and, thus, of deposition time. In a preferred embodiment, the mean thickness of the many sub-layers together provides a uniform thick and smooth layer, however the individual sub-layers can be less uniform. If needed, the deposition rate of the second material can be lowered to meet low doping concentrations by carrier gas flow rate Q or other process parameters, e.g. vapour pressure in the gas, source cell temperature, and gas flow.

In still a further embodiment, the step of providing the stack of at least three non-mixed sub-layers comprises providing the stack with an essentially uniform thickness over a stack area occupied by the stack.

According to a preferred embodiment, step of producing the layer structure comprises producing the layer structure as a charge carrier transport layer.

In another preferred embodiment, the step of providing the stack of at least three non-mixed sub-layers comprises providing the stack on a device electrode, wherein a first sub-layer of the stack on the device electrode is made of the second material and wherein a difference in energy of the workfunction of an electrode material of the device electrode and at least one of the electron affinity and the ionization potential of the second material is smaller than 1 eV.

In a preferred embodiment, the step of providing the stack of at least three non-mixed sub-layers comprises providing the stack with more than four sub-layers, preferably with more than six sub-layers, and more preferably with more than eight sub-layers.

According to a further embodiment, the step of producing the layer structure comprises producing the layer structure in an electronic device selected from the following group of electronic devices: a light emitting device, a light emitting diode, a solar cell, an organic light emitting device, an organic light emitting device, and an organic solar cell.

DESCRIPTION OF PREFERRED EMBODIMENTS OF THE INVENTION

Figure 2:
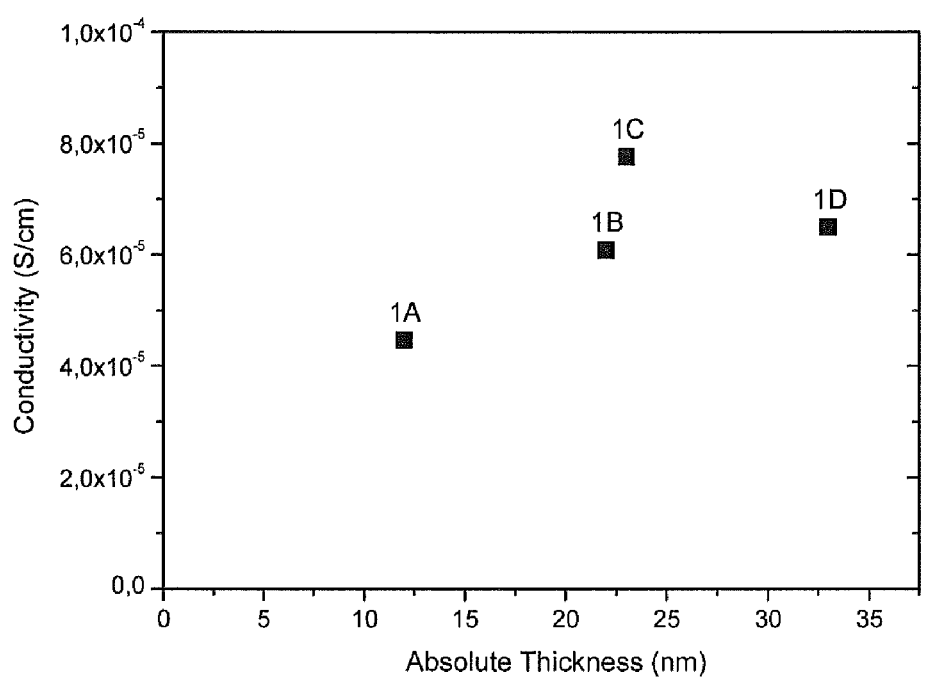
Figure 3:
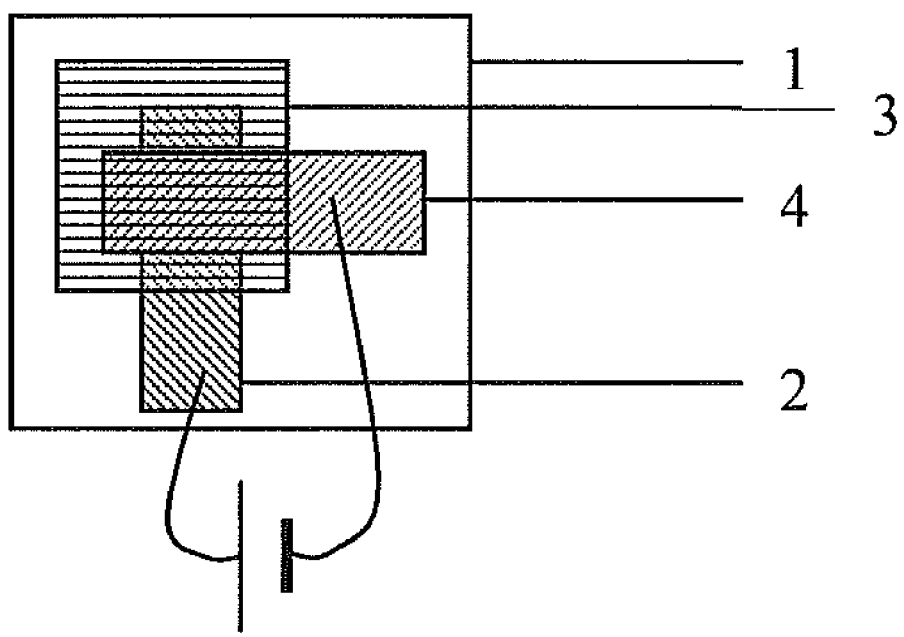
Figure 4:
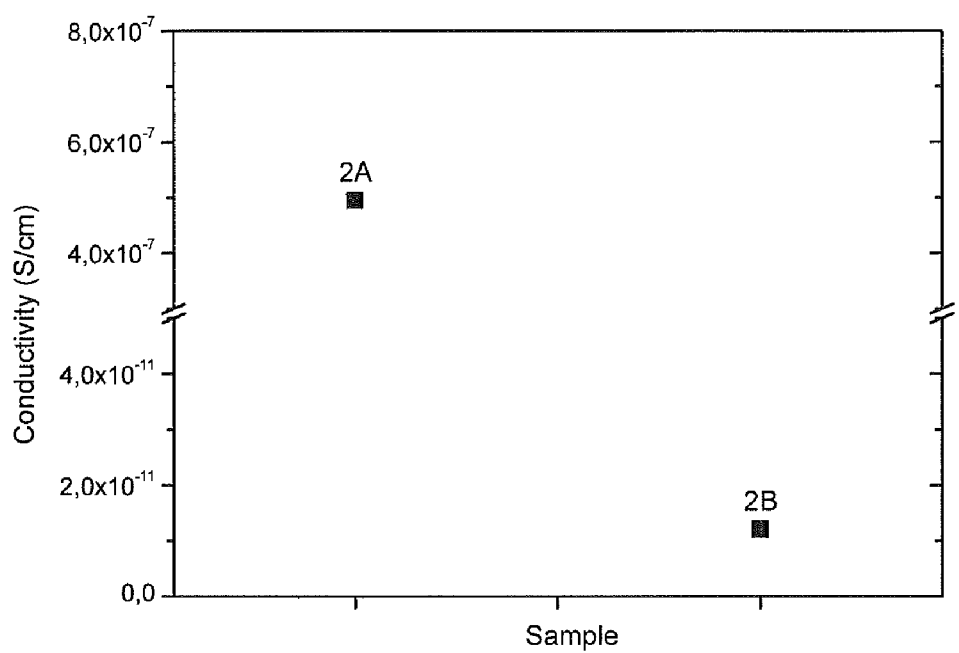
Figure 5:
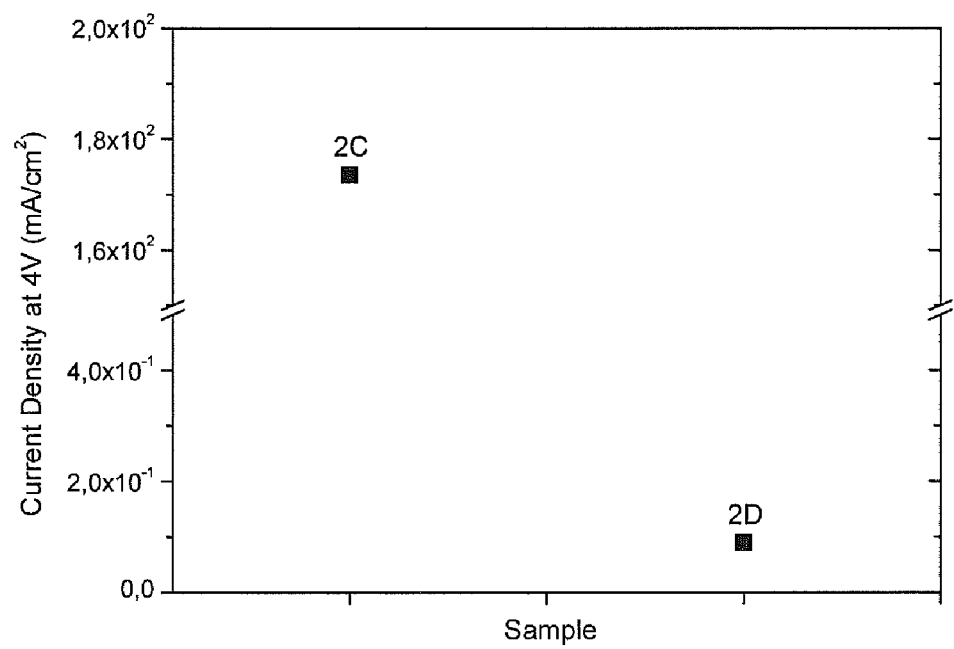

Following the invention is described in further detail referring to preferred embodiments of the invention. In the figures:

FIG. 1 schematically shows an arrangement for measuring electrical conductivity of a device comprising a stack of alternating non-mixed sub-layers made of a first (host) material and a second (dopant) material, respectively;

FIG. 2 shows a graphical depiction of the conductivity in dependence on the total thickness of organic layers for Examples 1A to 1D measured by the structure shown in FIG. 1 (data points are labeled with example name);

FIG. 3 schematically shows another arrangement for measuring electrical conductivity of an organic light emitting diode (OLED) comprising a stack of alternating non-mixed sub-layers made of a host material and a dopant material, respectively;

FIG. 4 shows a graphical depiction of the conductivity for samples 2A and 2B according to an Example 2 measured by the structure shown in FIG. 3; and FIG. 5 shows a graphical depiction of the current density for samples 2C and 2D according to the Example 2 measured by the structure shown in FIG. 3.

Following preferred embodiments of the invention are described. Layer structures in preferred embodiments are generated by at least one of VTE (VTE—Vacuum Thermal Evaporation) and OVPD (OVPD—Organic Vapour Phase Deposition) which is known as such. Process parameters used are as follows: Pressure $10^{-6}$ to $10^{-7}$ mbar; evaporation temperature for the host material −240 to 280° C.; evaporation temperature for the dopant material −130 to 170° C.; and evaporation temperature for all other organic materials −150 to 350° C. Materials were evaporated with rates of 0.05 to 0.2 nm/s. For other embodiments, the process parameters can be varied according to specific needs as it is known for VTE.

FIG. 1 schematically shows an arrangement for measuring electrical conductivity of a device comprising a stack of alternating non-mixed sub-layers made of a first material which may also referred to as host material and a second material, respectively. There are depicted glass substrate 1, electrically conductive stripes 2 made of ITO, and a stack 3 of alternating non-mixed sub-layers made of a host material and a dopant material. The arrangement shown in FIG. 1 is used for measurements of an Example 1 described below.

In an embodiment, a composite hole-transport layer is provided as a stack of sub-layers generated by at least one of VTE and OVPD as follows: 1 nm Pdop (1,3,4,5,7,8-Hexafluoronaphtho-2,6-chinontetracyanomethan)/10 nm STTB (2,7-Tetra-(di-p-Tolylamin)-9,9'-spirobifluoren)/1 nm Pdop/10 nm STTB/1 nm Pdop/10 nm STTB or 10 nm STTB/1 nm Pdop/10 nm STTB/1 nm Pdop/10 nm STTB/1 nm Pdop. The composite hole-transport layer shows behaviour like an electrically p-doped hole-transport layer.

In another embodiment, a composite electron-transport layer is provided as a stack of sub-layers generated by at least one of VTE and OVPD as follows: 1 nm Ndop (Tetrakis(1,2,3,3a,4,5,6,6a,7,8-decahydro-1,9,9b-triazaphenalenyl)ditungsten(II))/10 nm BPhen (4,7-Diphenyl-1,10-phenanthrolin)/1 nm Ndop/10 nm BPhen/1 nm Ndop/10 nm BPhen or 10 nm BPhen/1 nm Ndop/10 nm BPhen/1 nm Ndop/10 nm BPhen/1 nm Ndop. The composite electron-transport layer shows behaviour like an electrically n-doped electron-transport layer.

EXAMPLE 1

In an Example 1, a composite hole-transport layer is provided by a stack of sub-layers in VTE with the following structure:

1.1 Glass (Substrate)
1.2 Electrically Conductive ITO Stripes
1.3 Organic Layers Grown by VTE:

| layer | sample 1A | sample 1B | sample 1C | sample 1D |
|---|---|---|---|---|
| 1.3.1 | 1 nm Pdop | 1 nm Pdop | 1 nm Pdop | 1 nm Pdop |
| 1.3.2 | 10 nm STTB | 10 nm STTB | 10 nm STTB | 10 nm STTB |
| 1.3.3 | 1 mn Pdop | 1 nm Pdop | 1 nm Pdop | 1 nm Pdop |
| 1.3.4 | | 10 nm STTB | 10 nm STTB | 10 nm STTB |
| 1.3.5 | | | 1 nm Pdop | 1 nm Pdop |
| 1.3.6 | | | | 10 nm STTB |

The distance between ITO stripes is 1.25 mm. The organics are evaporated to cover ITO stripes at a length of 14 mm. FIG. 1 shows the layout in top view, i.e. as seen from evaporation source.

The composite hole-transport layer shows behaviour like an electrically p-doped hole-transport layer.

FIG. 2 shows a graphical depiction of the conductivity in dependence on the thickness for an Example 1 measured by the structure shown in FIG. 1.

The measurements were performed under in-situ conditions in vacuum after deposition of layers 1.3.1 to 1.3.6. A voltage of 10V was applied, and the current flowing in the specimen is measured. From the geometry of the sample electrical conductivity was calculated.

For Example 1A, a high conductivity $>10^{-6}$ S/cm was observed. Electrical conductivity of a 11 nm thick non-doped STTB layer is smaller than $10^{-8}$ S/cm and can not be measured in the configuration of FIG. 1 as currents are smaller than measurement error. In consequence, the conductivity of the stack is higher than the conductivity of a pure STTB layer. This proves that the beneficial doping effect is obtained in such a structure.

An even higher electrical conductivity is obtained if the thicknesses of the STTB sub-layers are reduced. Depending from the substrate and/or electrodes used for the device it may be beneficial to start the stack either with the host materials adjacent to the electrode or with the dopant materials adjacent to the stack. The electrode can be a material injecting electrons into an electron transporting stack or holes into a hole transporting stack. It can by itself consist of several layers or a mixture of materials.

Thicker layers with similar conductivity are achieved by extending the organic stack by additional layers of the type of the layers 1.3.1, and 1.3.2 as shown by examples 1B to 1D.

FIG. 3 schematically shows another arrangement for measuring electrical conductivity of an organic light emitting diode (OLED) comprising a stack of alternating non-mixed sub-layers made of a host material and a dopant material, respectively. There are depicted a glass substrate 1, electrically conductive stripes 2 made of ITO (bottom electrode), a stack 3 of organic layers including stacks of alternating non-mixed sub-layers made of a host material and a dopant material, and a layer 4 made of a metal (top electrode).

In an embodiment, an OLED comprising a p-type composite layer is configured as follows: glass substrate/ITO (Indium tin oxide)/p-doped layer as described above/NPB(N,N'-di (naphthalene-2-yl)-N,N'-diphenylbenzidine)=interlayer hole side/NPB:ORE (Iridium(III)bis(2-methyldibenzo-[f,h]quinoxaline)(acetylacetonate)) or $Alq_3$ (Tris(8-hydroxy-quinoline)aluminium):DCM (4-(Dicyanomethylene)-2-methyl-6-(p-dimethyl-aminostyryl)-4H-pyran)=emission layer/$Alq_3$/LiF (Lithium fluoride)/Al. All layers except the ITO, LiF and Al are deposited OVPD process.

In a further embodiment, an OLED comprising an n-type composite layer is configured as follows: glass substrate/ITO/CuPC (Copper phthalocyanine)=hole injection layer/NPB=hole transport layer/NPB:ORE or $Alq_3$:DCM=emission layer/BPhen=interlayer electron side/n-doped layer as described above/Al. All layers except the ITO and Al layers are deposited in OVPD process. Alternatively, all layers except ITO can be deposited in VTE.

Other OLED structures or variations of the OLED structures can easily be concluded from the above described schemes. For example OLEDs with p- and n-doped transport layers or OLEDs with more than one p-doped and n-doped transport layer can be made, e. g. stacked OLEDs with and without contacts or interlayer between unit stacks.

EXAMPLE 2

OLED

In an Example 2, a p-type composite layer and an OLED is provided by a stack of sub-layers and OLEDs featuring such composite layer in VTE of the following structure:
2.1 Glass (Substrate)
2.2 Electrically Conductive ITO Stripes
2.3 Organic Layers Grown by VTE
2.4 100 nm Layer of Aluminium Grown by VTE For different samples, the layer 2.3 was prepared as depicted in Table 1.

TABLE 1

| layer | sample 2A | sample 2B (conventional) | sample 2C | sample 2D (conventional) |
|---|---|---|---|---|
| 2.3.1 | 1 nm Pdop | | 1 nm Pdop | |
| 2.3.2 | 15 nm STTB | | 15 nm STTB | |
| 2.3.3 | 1 nm Pdop | | 1 nm Pdop | |
| 2.3.4 | 15 nm STTB | | 15 nm STTB | |
| 2.3.5 | 1 nm Pdop | | 1 nm Pdop | |
| 2.3.6 | 15 nm STTB | | 15 nm STTB | |
| 2.3.7 | | 47 nm STTB | | 47 nm STTB |
| 2.3.8 | | | 20 nm ORE in NPB (10%) | 20 nm ORE in NPB (10%) |
| 2.3.9 | | | 10 nm ETM | 10 nm ETM |
| 2.3.10 | | | 50 nm Ndop in ETM (8%) | 50 nm Ndop in ETM (8%) |

The active area of the devices is defined by the overlap of ITO bottom contact and Al top contact and is 6.7 $mm^2$ for all devices according to samples 2A to 2D. FIG. 4 shows the layout in top view, i. e. as seen from evaporation source.

Sample 2A is similar to Example 1D, however, the current flow is vertical to the organic layers. For the samples 2A and 2B, the conductivity of the HTL and the composite layer, respectively, can be directly determined, whereas for the samples 2C and 2D this is not possible. In those devices the current goes through the whole OLED stack, which acts a serial connection of layers of different conductivity. Therefore, for OLEDs (samples 2C and 2D), only current density at a given voltage is compared.

FIG. 4 shows a graphical depiction of the conductivity in dependence on the thickness for samples 2A and 2B according to the Example 2 measured by the arrangement shown in FIG. 3

The measurements were performed by applying a voltage of 4V. However, comparison with device according to undoped reference sample 2B shows drastic increase of conductivity from $10^{-11}$ S/cm to $5 \times 10^{-7}$ S/cm.

Normal conductivity is increased by reducing layer thickness by a given factor for all organic layers, while keeping total layer thickness constant by additional double layers of the type of the type of the layers 2.3.1, and 2.3.2.

FIG. 5 shows a graphical depiction of the current density in dependence on the thickness for samples 2C and 2D according to the Example 2 measured by the structure shown in FIG. 3.

The current density of the OLEDs according to samples 2C and 2D was measured at a voltage of 4V. The OLED device according to sample 2D with a non-doped HTL (hole transport layer) allows for a very low current density of $10^{-1}$ $mA/cm^2$, which reflects the low conductivity of HTL of device according to sample 2B. Introduction of stacked p-type composite layer increases measured current density to $2 \times 10^2$ $mA/cm^2$.

The device according to samples 2C shows bright homogeneous orange-red luminescence with an external quantum efficiency of about 8%. The emission spectrum peaks at 610 nm. Device according to sample 2D shows also orange-red electroluminescence, however emission is not homogeneous, and electro-optical characterization can not be quantified.

The features disclosed in the claims, the specification and/or the figure may be material for the realization of the invention in its various embodiments, taken in isolation or in various combinations thereof.

The invention claimed is:

1. An electronic device comprising:
a layer structure, wherein the layer structure comprises a composite layer structure comprising free charge carriers, wherein the free charge carriers are generated by charge transfer between a first material and a second material,
wherein the composite layer structure comprises a stack of at least three non-mixed sub-layers comprising the first material and the second material,
wherein within the stack of the at least three non-mixed sub-layers, each first material sub-layer is adjacent to a second material sub-layer, and each second material sub-layer is adjacent to a first material sub-layer, and
wherein the first material and the second material comprise a host-dopant material system for electrical doping.

2. The device according to claim 1, wherein the stack of the at least three non-mixed sub-layers has an electrical conductivity of at least about $10^{-8}$ S/cm.

3. The device according to claim 1, wherein the second material sub-layer(s) has a layer thickness between about 0.1 nm and about 5 nm.

4. The device according to claim 1, wherein the first material sub-layer(s) has a layer thickness between about 5 nm and about 15 nm.

5. The device according to claim 1, wherein at least one of the first material and the second material comprises an organic material.

6. The device according to claim 1, wherein the composite layer structure has a molar ratio between about 10:1 and about 1:10000 (second material:first material).

7. The device according to claim 1, wherein the stack has an essentially uniform thickness.

8. The device according to claim 1, wherein the layer structure is a charge carrier transport layer.

9. The device according to claim 1, wherein the stack is arranged on a device electrode comprising an electrode material, wherein the-sub-layer of the stack contacting the device electrode comprises the second material, and wherein a difference in energy of the workfunction of the electrode material and the second material's electron affinity or ionization potential is smaller than 1 eV.

10. The device according to claim 1, wherein the stack of at least three non-mixed sub-layers comprises more than four sub-layers.

11. The device according to claim 1, wherein the device is a light emitting device, a light emitting diode, a solar cell, an organic light emitting device, or an organic solar cell.

12. The device according to claim 1, wherein the stack of the at least three non-mixed sub-layers has an electrical conductivity of at least about $10^{-7}$ S/cm.

13. The device according to claim 1, wherein the stack of the at least three non-mixed sub-layers has an electrical conductivity of at least about $10^{-5}$ S/cm.

14. The device according to claim 1, wherein the second material sub-layer(s) has a layer thickness between about 0.1 nm and about 2 nm.

15. The device according to claim 1, wherein the second material sub-layer(s) has a layer thickness between about 0.1 nm and about 1 nm.

16. The device according to claim 1, wherein the first material sub-layer(s) has a layer thickness between about 8 nm and about 12 nm.

17. The device according to claim 1, wherein the composite layer structure has a molar ratio between about 1:1 and about 1:1000 (second material:first material).

18. The device according to claim 1, wherein the composite layer structure has a molar ratio between about 1:10 and about 1:100 (second material:first material).

19. The device according to claim 1, wherein the stack of at least three non-mixed sub-layers comprises more than six sub-layers.

20. The device according to claim 1, wherein the stack of at least three non-mixed sub-layers comprises more than eight sub-layers.

21. An article comprising at least one electronic device, wherein the electronic device comprises:
a layer structure, wherein the layer structure comprises a composite layer structure comprising free charge carriers, wherein the free charge carriers are generated by charge transfer between a first material and a second material,
wherein the composite layer structure comprises a stack of at least three non-mixed sub-layers comprising the first material and the second material,
wherein within the stack of the at least three non-mixed sub-layers, each first material sub-layer is adjacent to a second material sub-layer, and each second material sub-layer is adjacent to a first material sub-layer, and
wherein the first material and the second material comprise a host-dopant material system for electrical doping, and
wherein the article is selected from the group consisting of lighting device, display device, and solar accumulator.

* * * * *